(12) United States Patent
Liu et al.

(10) Patent No.: US 6,693,439 B1
(45) Date of Patent: Feb. 17, 2004

(54) APPARATUS AND METHODS FOR MEASURING NOISE IN A DEVICE

(75) Inventors: Zhihong Liu, Cupertino, CA (US); Kwok Kwong Hung, Fremont, CA (US); Hancheng Liang, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 09/672,942

(22) Filed: Sep. 28, 2000

(51) Int. Cl.[7] ............................................. G01R 29/26
(52) U.S. Cl. ........................................ 324/613; 324/612
(58) Field of Search ................................ 324/601, 612, 324/613, 614, 616, 763, 765; 330/149, 306; 702/65

(56) References Cited

U.S. PATENT DOCUMENTS

| | | | |
|---|---|---|---|
| 3,619,780 A | 11/1971 | Hoeks | 324/768 |
| 4,296,381 A | 10/1981 | Hofer | 330/149 |
| 4,491,783 A | 1/1985 | Sawayama et al. | 324/616 |
| 4,701,701 A | 10/1987 | Takagi | 324/769 |
| 4,908,570 A | 3/1990 | Gupta et al. | 324/765 |
| 4,998,071 A * | 3/1991 | Strid et al. | 324/613 |
| 5,166,625 A | 11/1992 | Guiga et al. | 324/613 |
| 5,789,933 A | 8/1998 | Brown et al. | 324/765 |
| 5,905,384 A | 5/1999 | Inoue et al. | 324/769 |
| 5,970,426 A * | 10/1999 | Martin | 702/65 |
| 5,970,429 A | 10/1999 | Martin | 702/65 |
| 6,029,117 A | 2/2000 | Devgan | 702/58 |
| 6,072,947 A | 6/2000 | Roychowdhury et al. | 703/14 |
| 6,106,563 A | 8/2000 | Stengel et al. | 703/13 |
| 6,114,858 A * | 9/2000 | Kasten | 324/616 |
| 6,397,160 B1 * | 5/2002 | Craig et al. | 702/120 |

OTHER PUBLICATIONS

Chen, Chun–Yu and Kuan, Chieh–Hsiung, "Design and Calibration of a Noise Measurement System," IEEE Transactions On Instrumentation and Measurement, IEEE Instrumentation and Measurement Society, vol. 49, No. 1 (Feb. 2000), pp. 77–82.

* cited by examiner

Primary Examiner—N. Le
Assistant Examiner—Walter Benson
(74) Attorney, Agent, or Firm—Pennie & Edmonds LLP

(57) ABSTRACT

An exemplary system for measuring noise in a device comprises a CPU, a memory coupled to the CPU, an interface coupled to the CPU for providing instructions processed by the CPU, a control unit coupled to the interface for receiving the instructions, a preamplifier circuit coupled to the control unit for implementing the instructions, a power supply unit controlled by the control unit for providing power to the preamplifier circuit, and a device holder selectively attached to the preamplifier circuit. In an exemplary embodiment, the preamplifier circuit further comprises a plurality of filters, an amplifier circuit, a plurality of switches for switching the amplifier circuit between a voltage amplifier mode and a current amplifier mode, and a variable loading resistor.

20 Claims, 17 Drawing Sheets

APPARATUS AND METHODS FOR MEASURING NOISE IN A DEVICE

FIELD OF THE INVENTION

This invention relates to apparatus and methods for measuring noise in a device. In particular, this invention relates to apparatus and methods for measuring noise in a transistor device.

BACKGROUND OF THE INVENTION

Circuit designers typically use design tools to design integrated circuits. The most common design tools are the so-called simulated-program-with-integrated-circuit-emphasis (SPICE) and the fast device level simulators (e.g., Star-Sim, ATS, MACH TA, and TIMEMILL). Typically, design tools, such as SPICE and fast device level simulators, describe individual device and its connections in a line-by-line manner. Examples of individual devices are resistor, capacitor, inductor, bipolar junction transistor, and metal oxide semiconductor field effect transistor (MOSFET). In a design tool, each line, which includes a description of a device, is sometimes referred to as a device specification instance.

FIG. 1A illustrates an exemplary netlist developed by a design tool, such as SPICE. As shown in FIG. 1A, a netlist 101 typically includes three sections: a circuit description section 103, a models section 105, and an analysis section 107. The circuit description section 103 contains a description of each device and sub-circuit as well as interconnections between the devices and sub-circuits within an integrated circuit. The models section 105 contains a description of individual device and sub-circuit behavior. Typically, the models section 105 comprises a library of model parameters, model parameter values, and model equations. Generally, the behavior of each type of device (e.g., a MOSFET) can be simulated by at least one model equation, which includes a combination of model parameters. The analysis section 107 typically includes analysis instructions to simulate a device, sub-circuit, or circuit (e.g., output voltage over time) using information in the circuit description section 103 and the models section 105.

In order to meet continuous demands to reduce manufacturing costs and device size, many manufacturers have begun to manufacture chips that contain all components of an integrated circuit. Although less expensive to manufacture, such chips are more expensive to design. One important design factor is to measure and account for device and chip noise. Noise is a phenomenon that exists in analog or digital devices in an integrated circuit. Typically, noise is inversely proportional to device size. That is, as device size decreases, noise increases. Thus, as the industry continues to reduce device size, it is increasingly important to be able to measure and account for noise during integrated circuit design.

In most existing noise measurement systems, three components are present: a biasing system for biasing a device under test (DUT), a noise amplifier for amplifying noise measured from the DUT, and a control unit for controlling the biasing system and the amplifier. An efficient noise measuring system requires that the noise measuring system itself does not generate noise that interferes with or engulfs the noise measured from the DUT.

In some existing biasing systems, batteries are used to bias a DUT. Batteries are pure chemical power sources, thus, are relatively noiseless. One drawback of using batteries as a power source is that the voltage provided by a battery is typically not adjustable. Some biasing systems use a potential meter to adjust battery voltage. However, a potential meter generally produces unwanted thermal noise when used. In other existing biasing systems, an electronic circuit is connected to a battery to adjust battery voltage. Using such electronic circuit, for example a digital-to-analog converter, is preferable over using a potential meter because the electronic circuit is generally quieter. However, designing an effective and quiet electronic circuit can be very expensive; thus, this solution is not widely adopted. In yet other existing biasing systems, a commercial programmable DC power supply is used. Such commercial DC power supply can be programmed to provide adjustable biasing voltages. A drawback of the commercial DC power supply is that the power supply itself generates noise.

In most noise measurement systems, a noise amplifier is used to amplify a weak DUT noise to a measurable level. To be effective, the amplifier should generate minimal noise and that amplifier noise should be distinguishable from the measured DUT noise. Further, ideally, the noise amplifier should be capable of amplifying a wide range of noise frequencies (e.g., between 0 Hz and 1 MHz). Generally, an amplifier has its own input impedance. Amplifier performance generally improves if the amplifier impedance is closely matched by the impedance of the DUT. In most existing amplifiers, the amplifier impedance is generally fixed or very difficult to adjust. Thus, to achieve impedance matching, the DUT impedance should be adjustable to match the amplifier impedance.

Thus, it is desirable to provide apparatus and methods for effectively measuring noise in a device such as a transistor device.

SUMMARY OF THE INVENTION

An exemplary apparatus for measuring noise in a device comprises a plurality of programmable power supply units, a plurality of filter circuits coupled to the power supply units and selective terminals of a device, a variable loading resistor circuit coupled to a first terminal of the device, a calibration circuit coupled to a second terminal of the device, an amplifier circuit coupled to the first terminal of the device, and an output analyzer coupled to the amplifier circuit. The calibration circuit calibrates a gain of both the device and the amplifier circuit under each bias condition. In one embodiment, each of the plurality of filter circuits comprises a variable resistor and a capacitor coupled to the variable resistor. In another embodiment, the variable loading resistor circuit comprises a plurality of resistors selectably coupled in parallel, such that each resistor of the plurality of resistors can be turned on via a switch individually or in combination with other resistors of the plurality of resistors. In yet another embodiment, the variable loading resistor circuit further comprises a switch for shorting the variable loading resistor circuit.

In an exemplary embodiment of the apparatus, the amplifier circuit comprises a first phase amplifier circuit and a second phase amplifier circuit. In one embodiment, the first phase amplifier circuit includes a switch assembly. The switch assembly switchable coupling a voltage amplifier, a current amplifier, or a short circuit based on the impedance of the device. In another embodiment, the first phase amplifier circuit is configured to operate in a voltage amplifier mode or a current amplifier mode based on the impedance of the device. The second phase amplifier circuit further amplifies signals received from the first phase amplifier circuit.

In another exemplary embodiment, the apparatus further includes a protection circuit for discharging accumulated charge. The protection circuit is switchable coupled to the second terminal of the device. In yet another exemplary embodiment, the apparatus further includes a variable input resistor that is switchable coupled between the second terminal of the device and a filter circuit. In one embodiment, the variable input resistor is connected when the device is a bipolar transistor or a deep submicron device.

An exemplary method for measuring noise in a device comprises receiving a bias condition, measuring direct current operating points based on said bias condition, determining a loading resistor value based on a device impedance and an amplifier impedance, calculating a supply voltage based on the direct current operating points and the loading resistor value, selecting an amplifier mode based on the device impedance, calibrating a device gain and an amplifier gain, measuring noise data under the bias condition, removing an undesired portion of the noise data to obtain device noise data, extracting a model based on the device noise data, and simulating the extracted model. In one embodiment, calculating a supply voltage includes calculating an initial voltage value, measuring a supply current, comparing the supply current to a sum of a leak current and a device current, setting the supply voltage to the initial voltage if the supply current is equal to the sum, incrementing the supply voltage by a change voltage if the supply current is not equal to the sum and repeating the measuring and comparing. In another embodiment, calculating a supply voltage further comprises receiving an error percentage and calculating the change voltage based on the error percentage.

In an exemplary embodiment, an amplifier mode is selected by measuring noise densities at a plurality of loading resistance and selecting a voltage amplifier mode or a current amplifier mode based on the measuring. In another exemplary embodiment, a voltage amplifier mode is selected if the device impedance is low and a current amplifier mode is selected if the device impedance is high. In another exemplary embodiment, device and amplifier gains are calibrated by providing an alternate current signal at an input terminal of the device, measuring an output voltage at an output terminal of the device, and calculating the device gain and the amplifier gain based on the input voltage and the output voltage.

In one embodiment, an undesired portion of the noise data is removed in a de-embedding process that includes determining a system noise and separating the system noise from the noise data. In an exemplary embodiment, extracting a model includes extracting a direct current model having direct current model parameters, extracting frequency dependent model parameters, extracting noise data at one or more sampling frequency, associating the noise data to at least one bias condition, and extracting a noise model based on the associating and the direct current model parameters. In another exemplary embodiment, simulating the model includes generating a test circuit based on the model and simulating the test circuit.

An exemplary computer program product for measuring noise in a device comprises logic code for receiving a bias condition, which indicates the condition to measure noise in the device, logic code for measuring direct current operating points based on the bias condition, logic code for determining a loading resistor value based on a device impedance and an amplifier impedance, logic code for calculating a supply voltage based on the direct current operating points and the loading resistor value, logic code for selecting an amplifier mode based on the device impedance, logic code for calibrating a device gain and an amplifier gain, logic code for measuring noise data under the bias condition, logic code for removing an undesired portion of the noise data to obtain device noise data, logic code for extracting a model based on the device noise data, and logic code for simulating the extracted model.

In one embodiment, the logic code for calculating a supply voltage includes logic code for calculating an initial voltage value, logic code for measuring a supply current, logic code for comparing the supply current to a sum of a leak current and a device current, logic code for setting the supply voltage to the initial voltage if the supply current is equal to the sum, logic code for incrementing the supply voltage by a change voltage if the supply current is not equal to the sum and repeating the measuring and comparing. In another embodiment, the logic code for calculating a supply voltage further comprises logic code for receiving an error percentage and logic code for calculating the change voltage based on the error percentage.

In yet another embodiment, the logic code for selecting an amplifier mode includes logic code for measuring noise densities at a plurality of loading resistance and logic code for selecting a voltage amplifier mode or a current amplifier mode based on the measuring. In another embodiment, a voltage amplifier mode is selected when the device impedance is low and a current amplifier mode is selected when the device impedance is high.

In an exemplary embodiment, the logic code for calibrating a device gain and an amplifier gain includes logic code for providing an alternate current signal at an input terminal of the device, logic code for measuring an output voltage at an output terminal of the device, and logic code for calculating the device gain and the amplifier gain based on the input voltage and the output voltage. In another exemplary embodiment, the logic code for removing an undesired portion of the noise data includes logic code for determining a system noise and logic code for separating the system noise from the noise data.

In an exemplary embodiment, the logic code for extracting a model includes logic code for extracting a direct current model having direct current model parameters, logic code for extracting frequency dependent model parameters, logic code for extracting noise data at one or more sampling frequency, logic code for associating the noise data to at least one bias condition, and logic code for extracting a noise model based on the direct current model parameters and the association between the noise data to the at least one bias condition. In one embodiment, the logic code for simulating the model includes logic code for generating a test circuit based on the model, and logic code for simulating the test circuit.

An exemplary system for measuring noise in a device comprises a CPU, a memory coupled to the CPU, an interface coupled to the CPU for providing instructions processed by the CPU, a control unit coupled to the interface for receiving the instructions, a preamplifier circuit coupled to the control unit for implementing the instructions, a power supply unit controlled by the control unit for providing power to the preamplifier circuit, and a device holder selectively attached to the preamplifier circuit. In an exemplary embodiment, the control unit further comprises a front panel having a plurality of control buttons. the control buttons are configured to allow manual control of the preamplifier circuit and the power supply unit. In another embodiment, control unit further comprises a microprocessor for implementing a firmware when the control buttons are operated. In yet another embodiment, the preamplifier circuit further comprises a plurality of filters, an amplifier circuit, a plurality of switches for switching the amplifier circuit between a voltage amplifier mode and a current amplifier mode, and a variable loading resistor.

DETAILED DESCRIPTION OF THE INVENTION

Figure 1A:
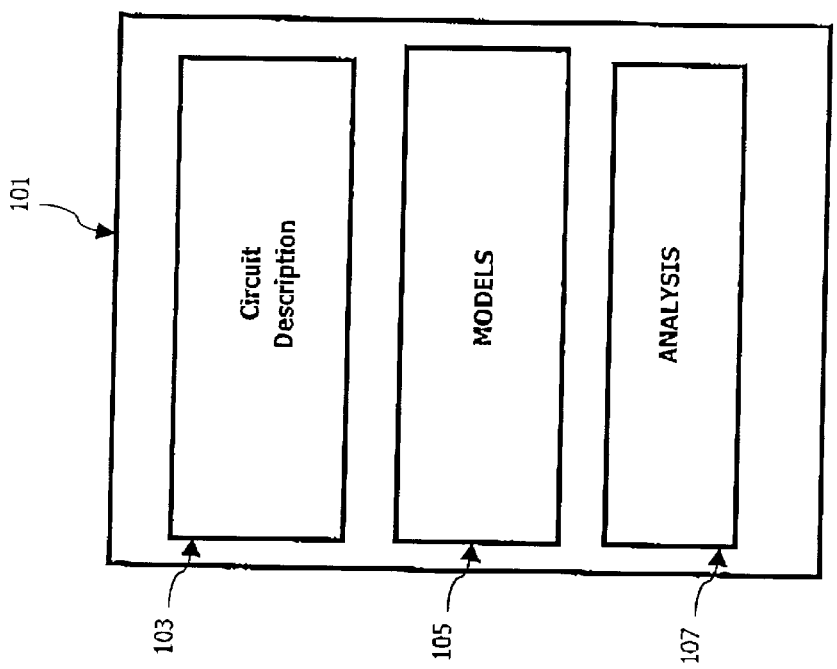
FIG. 1A schematically illustrates a netlist in accordance with prior art.
Figure 2:
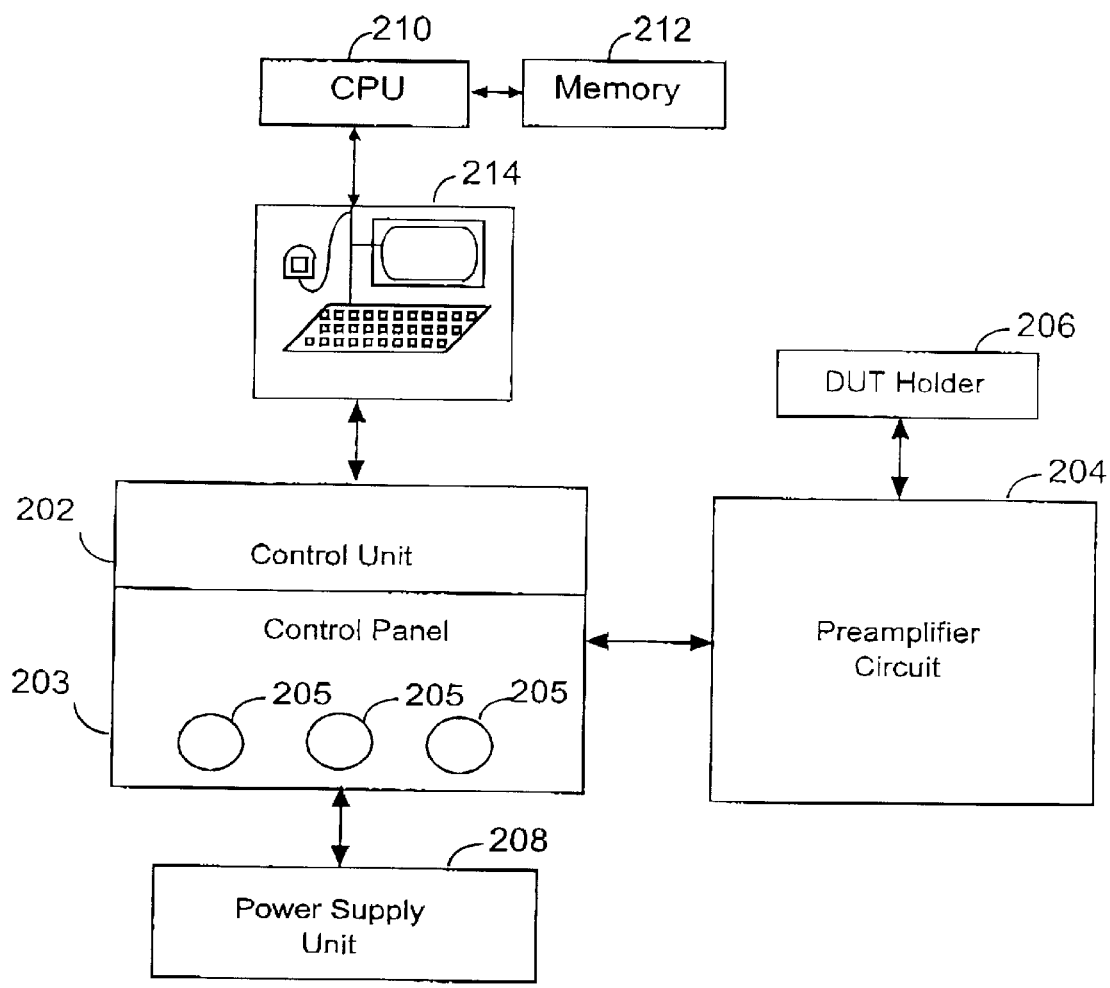
FIG. 2 schematically illustrates an exemplary noise measurement system in accordance with an embodiment of the invention.

FIG. 2 schematically illustrates an exemplary noise measurement system 200 in accordance with an embodiment of the invention. The noise measurement system 200 includes a control unit 202, a preamplifier circuit 204, a DUT holder 206, a power supply unit 208, a CPU 210, a memory 212, and a computer system interface 214. In an exemplary embodiment, the control unit 202 includes a control panel, a microprocessor, batteries, and battery chargers. The preamplifier circuit 204 includes filters, relay switches, preamplifier, loading resistor, input resistor, and a protection circuit. An embodiment of all of the above components in the preamplifier circuit 204 will be described in more detail in FIGS. 3A and 3B below. The DUT holder 206 holds at least one device under test. In an exemplary embodiment, the DUT holder 206 is directly connected to the preamplifier circuit 204 without using a cable (which may generate noise). The power supply unit 208 includes programmable power supply for the noise measurement system 200. In an exemplary embodiment, the noise measurement system 200 is automatically controlled by the execution of an external software stored in the memory 212. The external software is executed by the CPU 210, which provides instructions to the control unit 202 via the computer system interface 214.

In another exemplary embodiment, the control unit 202 includes a control panel 203 that allows a user to manually control the noise measurement system 200 by operating buttons 205 on the panel 203. For example, the control buttons 205 allow manual control to adjust loading resistor value and input resistor value, change the time constant of the filters, switch between a voltage amplifier and a current amplifier, and other functions. In one embodiment, in the control unit 202 is controlled by an internal firmware via the microprocessor when the control buttons are used. The internal firmware, when executed by the microprocessor, provides basic instructions to the preamplifier circuit 204.

The noise measurement system 200 is advantageous over existing systems because system noise is minimized by separating the control unit 202, the power supply unit 208, the CPU 210, and the preamplifier circuit 204 via cable lines. Thus, noise generated by all the components other than the preamplifier circuit 204 does not interfere with noise measured from a DUT located in the DUT holder 206.

Figure 3A:
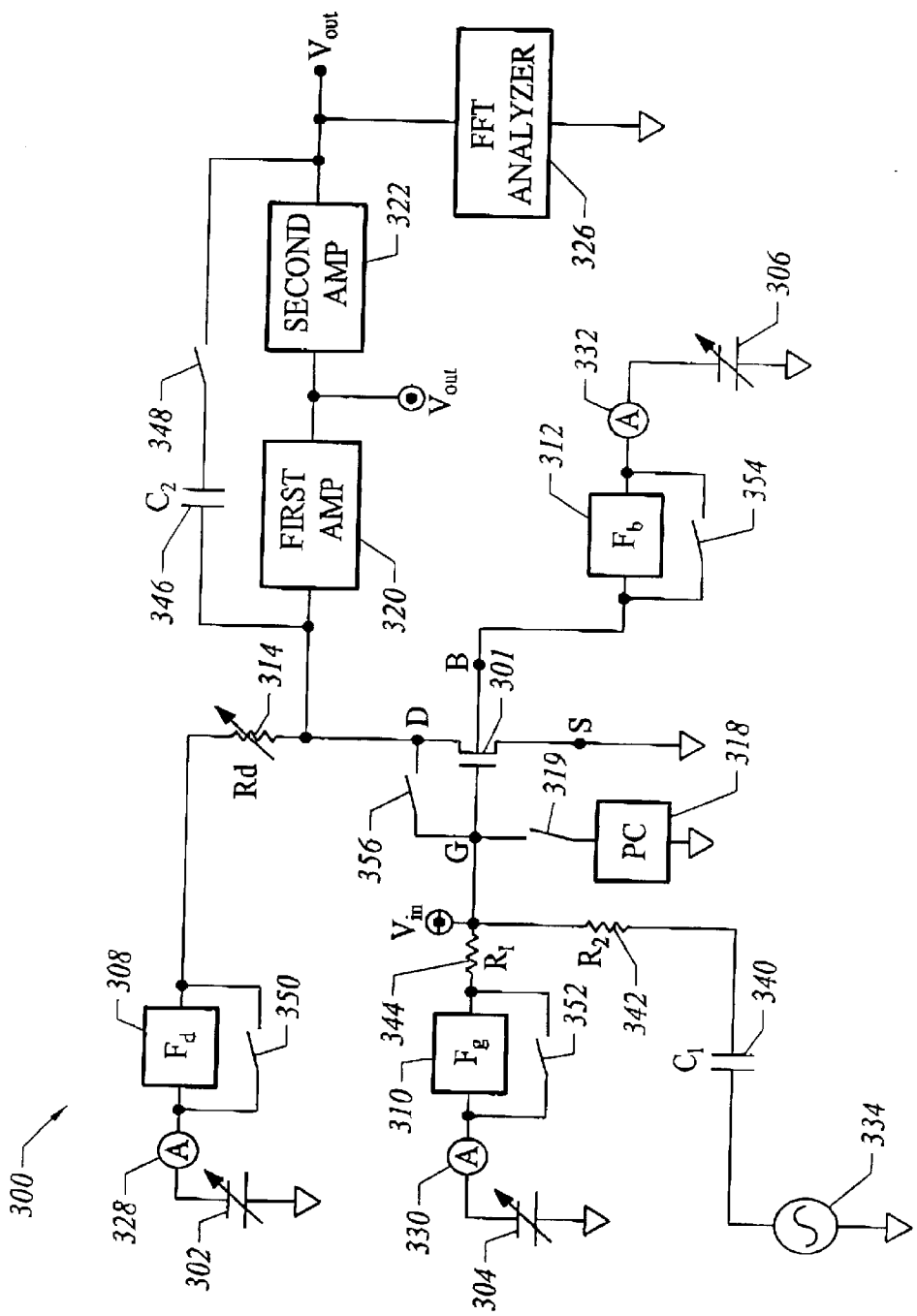
FIG. 3A schematically illustrates an exemplary noise measurement circuit in accordance with an embodiment of the invention.

FIG. 3A schematically illustrates an exemplary noise measuring circuit 300 connected to a DUT 301 in accordance with an embodiment of the invention. In FIG. 3A, the DUT 301 is a metal oxide semiconductor field effect transistor (MOSFET) having a source (S), a drain (D), a gate terminal (G), and a bulk (B). A person skilled in the art would recognize that other devices, such as a bipolar transistor, may replace the MOSFET. The DUT 301 is switchable connected to the noise measuring circuit 300 via a switch 356. A source monitor unit (SMU) 302 is switchable coupled to a filter circuit ($F_d$) 308 via a switch 350. The SMU 302 provides biasing voltages to the drain through a variable loading resistor ($R_d$) 314. In an exemplary embodiment, the variable loading resistor ($R_d$) 314 is coupled between the filter circuit $F_d$ 308 and the drain of the DUT 301 when the switch 350 is "on." A SMU 304 switchable coupled to a filter circuit ($F_g$) 310 via a switch 352 provides biasing voltages to the gate terminal of the DUT 301. A SMU 306 switchable coupled to a filter circuit ($F_b$) 312 via a switch 354 provides biasing voltages to the bulk of the DUT 301. The source of the DUT 301 is grounded. In an exemplary embodiment, each SMU 302, 304, and 306 includes a current meter 328, 330, and 332, respectively. Generally, input voltage can be monitored by a input monitor ($V_{in}$) at the gate terminal of the DUT 301 and output voltage can be monitored by an output monitor ($V_{out}$) between the first phase amplifier circuit 320 and the second phase amplifier circuit 322.

The drain of the DUT 301 is also switchable coupled to a first phase amplifier circuit 320 and a second phase amplifier circuit 322 via a switch 348. In one embodiment, when the switch 348 is on, the first phase amplifier circuit 320 and the second amplifier circuit 322 are by-passed; the drain of the DUT 301 is connected to a capacitor C2 346 then to a fast Fourier transformation (FFT) analyzer 326. In another embodiment, when the switch 348 is off, the drain of the DUT 301 is coupled to the first phase amplifier circuit 320 and the second phase amplifier circuit 322; the second amplifier circuit 322 is also coupled to the FFT analyzer 326. The FFT analyzer 326 transforms measured noise signals into a frequency domain. In an exemplary embodiment, the noise measurement circuit 300 includes an alternate current (AC) generator 334 for calibrating the circuit 300. The AC generator 334 connects to the gate terminal of the DUT 301 via a capacitor C1 340, a resistor R2 342, and a resistor R1 344, which in combination functions as a voltage divider to prevent current generated by the AC generator 334 from flowing into the filter Fg 310 and cause a system break down.

In an exemplary embodiment, a protection circuit 318 is coupled to the gate terminal via a switch 319. In one embodiment, the protection circuit 318 includes a resistor (not shown) that is grounded. Typically, the gate terminal is a high impedance node; thus, the gate terminal accumulates unwanted charge that, if suddenly discharged, may cause the DUT 301 to break down. The protection circuit 318 prevents such sudden discharge by draining any accumulated charge to ground when the switch 319 is on. Generally, the noise measuring circuit 300 can be operated in three modes: (1) the DC operating mode; (2) the AC operating mode; and (3) the calibration mode. During the DC operating mode, all filters (308, 310, and 312), the first phase amplifier circuit 320, the second phase amplifier circuit 322, the variable loading resistor $R_d$ 314, and any variable input resistor $R_b$ 316 are shorted from the circuit 300. The DC characteristics of the DUT 301 is measured by providing various bias conditions via the SMUs 302, 304, and 306, as appropriate. During the AC operating mode, in an exemplary embodiment, the circuit 300 is connected as shown in FIG. 3A. DUT noise is measured during AC operating mode. During the calibration mode, the noise measuring circuit 300 is the same as during AC operating mode. However, instead of measuring DUT noise, AC signals are provided by the AC signal generator 334 and output is measured by the FFT analyzer 326 to assess DUT and/or amplifier circuit gains at various bias conditions.

Figure 3B:
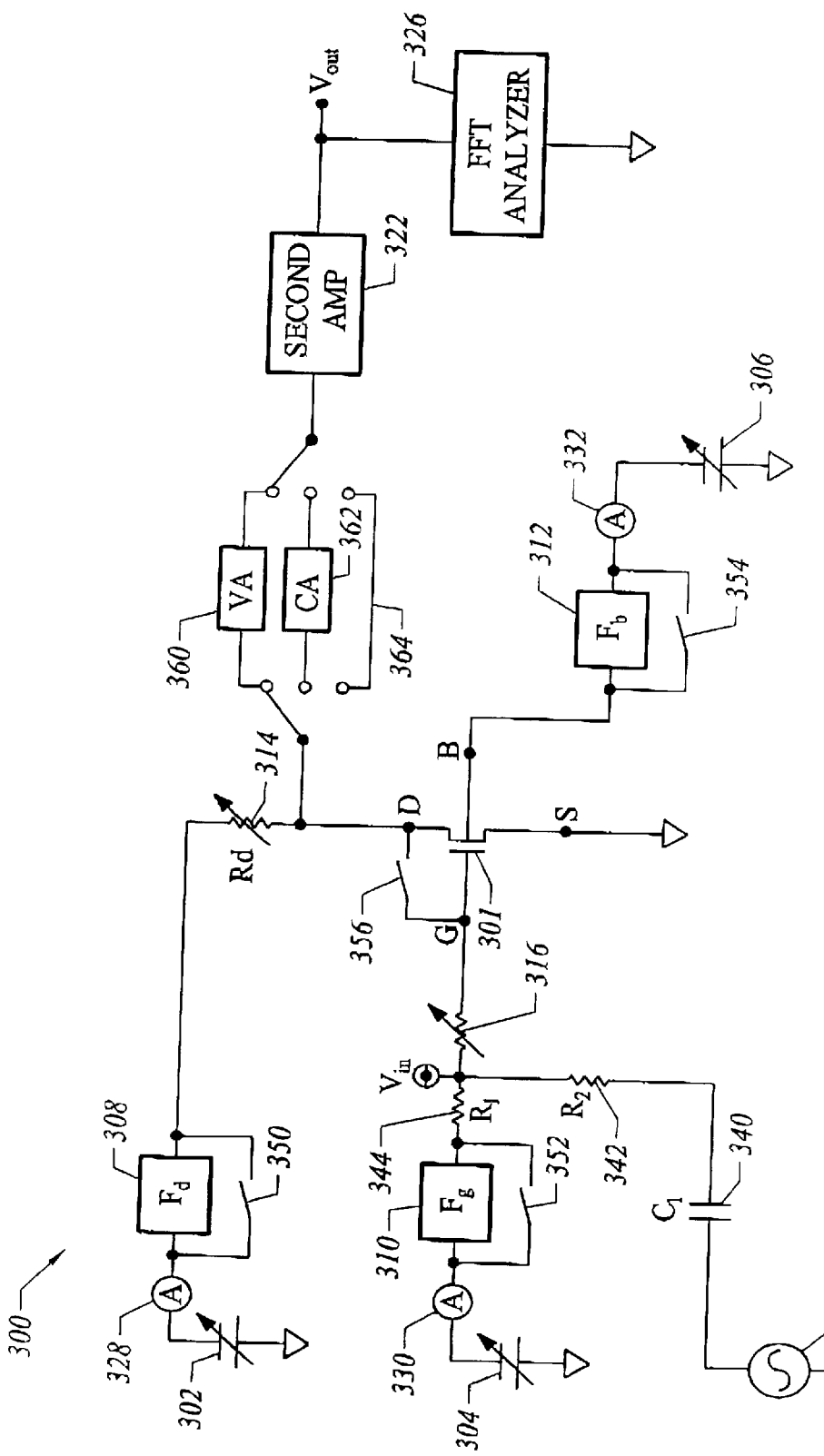
FIG. 3B schematically illustrates another exemplary noise measurement circuit.

FIG. 3B schematically illustrates another exemplary noise measuring circuit 300 in accordance with an embodiment of the invention. In this embodiment, a variable input resistor ($R_b$) 316 is coupled between the gate terminal and the filter circuit $F_g$ 310. The variable input resistor $R_b$ 316 is coupled to the noise measuring circuit 300 when the DUT is a bipolar device or any deep submicron transistor (e.g., MOSFET). The gate oxide of a deep submicron MOSFET is so thin that it can be very leaky. Thus, $R_b$ 316 is needed to prevent a device breakdown when a sudden surge of current is applied to the gate terminal.

In addition, in FIG. 3B, the first phase amplifier circuit 320 includes a switch assembly. In accordance with commands from the control unit 202, the first phase amplifier circuit 320 can function as a voltage amplifier 360, a current amplifier 362, or a short circuit 364. In an exemplary embodiment, the second phase amplifier circuit 322 has the same structure as the first phase amplifier circuit 320. Thus, the second phase amplifier circuit 322 can also switchable function as a voltage amplifier, a current amplifier, or a short circuit. Typically, the second phase amplifier circuit 322 is switched to match the function of the first phase amplifier circuit 320 (e.g., both circuits function as voltage or current amplifiers). When the noise generated by the DUT 301 is great, the amplifier circuits 320 and 322 may be shorted because such noise does not need to be amplified. When the DUT impedance is low, the circuits 320 and 322 should function as voltage amplifiers. Similarly, when the DUT impedance is high, the circuits 320 and 322 should function as current amplifiers.

In an exemplary embodiment, the first phase amplifier circuit 320 includes an amplifier which is configured as a voltage amplifier when the circuit 320 is in a voltage amplifier mode and is configured as a current amplifier when the circuit 320 is in a current amplifier mode. In an exemplary embodiment, the second phase amplifier circuit 322 is configured the same way as the first phase amplifier circuit 320 for further amplifying noise signal received from the first phase amplifier circuit 320. In a preferred embodiment, a battery is used as the separate power supply for the amplifier in the first phase amplifier circuit 320 and the second amplifier circuit 322. In this embodiment, a first battery is continuously monitored. When the first battery charge level becomes low, a second battery is automatically swapped with the first battery. After swapping, the first battery is automatically recharged and the second battery is monitored.

Figure 4:
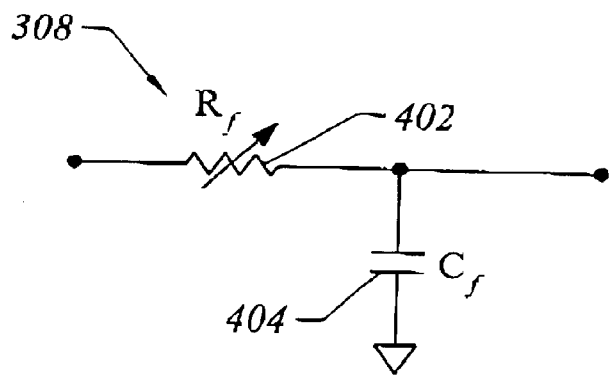
FIG. 4 schematically illustrates an exemplary filter circuit in accordance with an embodiment of the invention.

FIG. 4 schematically illustrates an exemplary filter circuit $F_d$ 308 in accordance with an embodiment of the invention. In FIG. 4, the filter circuit $F_d$ 308 is a RC circuit that includes a variable resistor $R_f$ 402 and a low leakage capacitor $C_f$ 404. It is well known in the art that in a RC circuit, the time constant "96" is equal to the product of R and C and that the filter circuit $F_d$ 308 is more efficient as $\tau$ becomes larger. There are at least two ways to make $\tau$ large. First, when $C_f$ 404 is large, $\tau$ is large. In one embodiment, $C_f$ 404 can be made large by using two electrolytic capacitors. An electrolytic capacitor has opposite polarities at each end; thus, two electrolytic capacitors are coupled in series to cancel that opposite polarities. When the electrolytic capacitors are used, however, high current leakage often results. Such high current leakage may sometimes be higher than the DC current supplied to the DUT 301. Thus, in a preferred embodiment, the $C_f$ 404 is a fixed standard low leakage capacitor instead of electrolytic capacitors. In an exemplary embodiment, the $C_f$ 404 may be represented by a set of capacitors coupled in parallel.

Another way to make $\tau$ large is to dynamically adjust the variable resistor $R_f$ 402. In one embodiment, when the SMU 302 supplies a high DUT current, a small $R_f$ 402 is used. In another embodiment, when the SMU 302 supplies a low DUT current, a large $R_f$ 402 is used. Thus, a substantially constant voltage drop is maintained across the $R_f$ 402. As the $R_f$ 402 becomes larger, it generates a higher undesirable voltage drop. When the SMU 302 supplies a high DUT current, the DUT 301 generates a relatively high noise frequency than when the SMU 302 supplies a low DUT current; thus, the filter $F_d$ 308 does not need to be as noiseless as it should be when the SMU 302 supplies a low DUT current. In one embodiment, filter circuits $F_b$ 312 and $F_g$ 310 have the same structure as filter circuit $F_d$ 308. The embodiment as disclosed in FIG. 4 is advantageous over prior art filter circuits because it does not generate intolerable leakage current and voltage drop.

Figure 5:
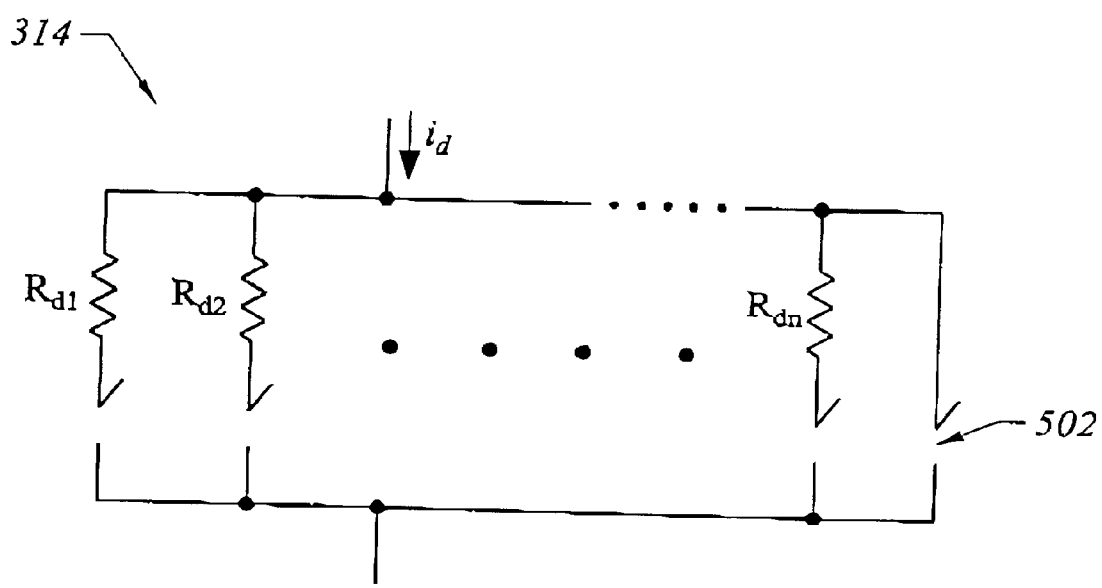
FIG. 5 schematically illustrates an exemplary loading resistor bank in accordance with an embodiment of the invention.

FIG. 5 schematically illustrates an exemplary variable loading resistor $R_d$ 314 in accordance with an embodiment of the invention. The variable $R_d$ 314 includes a bank of resistors selectively coupled in parallel ($R_d1, R_d2, \ldots, R_{dn}$) via switches. In an exemplary embodiment, the bank of resistors can be turned on individually or in combination with each other. In addition, variable $R_d$ 314 can be selectively shorted via a switch 502. In one embodiment, the $R_d$ 314 is shorted for calibrating the first phase amplifier circuit 320 and/or the second phase amplifier circuit 322. The variable $R_d$ 314 can be adjusted to achieve impedance matching with an amplifier impedance and maintain a substantially constant voltage drop.

Referring back to FIG. 3A, the variable $R_d$ 314 is coupled in parallel with the DUT impedance ($G_{ds}$) and in parallel with the amplifier impedance ($R_{in}$). The combined impedance of the variable $R_d$ 314 and the DUT 301 can be adjusted to closely match the amplifier impedance $R_{in}$ by adjusting the variable $R_d$ 314. A close impedance match results in improved amplifier performance. Because the DUT 301 could be a transistor having a wide range of impedance variations (e.g., 100 ohms–1G ohms), the variable $R_d$ 314 is adjustable to a wide range of resistance. In addition, the variable $R_d$ 314 is adjustable to maintain a substantially constant voltage drop to prevent a DUT break down. In an exemplary embodiment, if the drain current ($I_d$) is high, the variable $R_d$ 314 should be adjusted to have a small resistance. Likewise, when the $I_d$ is low, the variable $R_d$ 314 should be adjusted to have a large resistance.

Referring back to FIG. 3B, if the variable input resistor $R_b$ 316 is included in the noise measuring circuit 300, the variable $R_b$ 316 includes a bank of resistors similar to variable $R_d$ 314 to allow for similar resistance adjustment.

Figure 6:
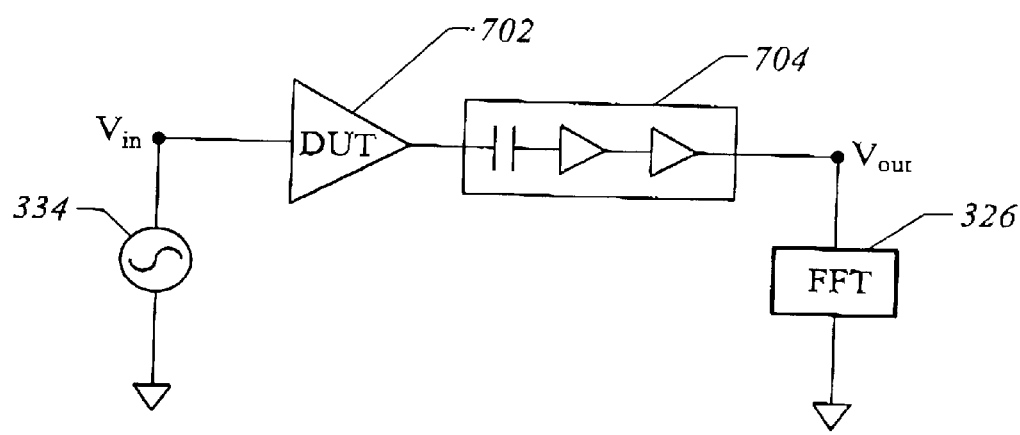
FIG. 6 schematically illustrates an exemplary noise measuring circuit in calibration mode in accordance with an embodiment of the invention.

FIG. 6 schematically illustrates an exemplary noise measuring circuit 300 coupled to the DUT 301 in calibration mode in accordance with an embodiment of the invention. During calibration mode, the gain of the system 200 (including the circuit 300 and the DUT 301) is calibrated at various bias conditions. Such calibration results can be used to determine how much amplification is needed from the first phase amplifier circuit 320 and the second phase amplifier circuit 322. In an exemplary embodiment, the amount of amplification needed depends on many factors, including theoretical calculation, coupling capacitance, loading resistance, input resistance, transistor frequency responses, and other factors.

During calibration mode, the noise measuring circuit 300 and the DUT 301 are simplified to be essentially a two-stage amplifier. The DUT 301 functions as a first stage amplifier 702 of the AC signals from the AC signal generator 334. The first phase amplifier circuit 320 and the second phase amplifier circuit 322 function as a second stage amplifier 704 of the AC signals from the AC signal generator 334. AC signals at various frequency amplitudes (bias conditions) are amplified through the amplifiers 702 and 704, and output voltages are measured by the FFT analyzer 326. System gains can be calculated based on such output voltages. Ideally, system gains should be constant under any bias condition. However, in practical application, system gain is a function of bias condition. Calibration at various bias conditions allows later measurement of even low frequency DUT noise because the system's sensitivity to low frequency noise has been determined. Further, the amplification provided by a DUT 301 is dependent on the type of DUT device (e.g., MOSFET, bipolar transistor, etc.). Thus, the system gain has to be re-calibrated each time the noise of a new DUT is to be measured.

Figure 7:
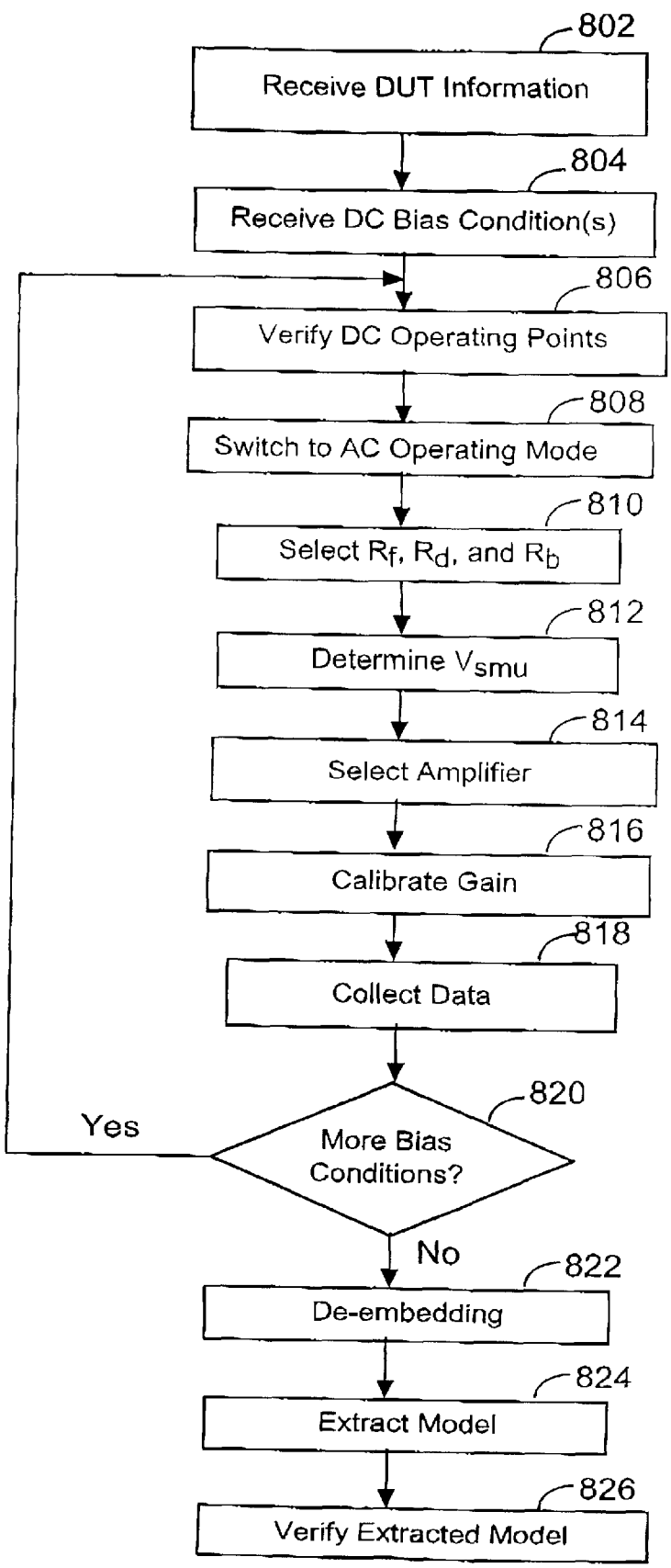
FIG. 7 illustrates an exemplary process in accordance with an embodiment of the invention.

FIG. 7 illustrates an exemplary noise measuring process in accordance with an embodiment of the invention. At step 802, DUT information (e.g., device dimension, temperature, conduction type, etc.) is received. Next, DC bias condition(s) is received (step 804). In one embodiment, a user is prompted to enter desired bias conditions (e.g., desired drain current). In another embodiment, sample bias conditions are automatically generated. The received bias condition is verified (step 806). In one embodiment, the noise measuring circuit 300 is set to the DC operating mode and a DC voltage is applied in accordance with a specified bias condition. Under the DC voltage, various DC operating points (e.g., threshold voltage ($V_t$), drain current ($I_d$), gate current ($I_g$), device gain ($G_{ds}$), drain to source voltage ($V_{ds}$), beta ($\beta$) etc.) are determined. In an exemplary embodiment, an optional step to check amplifier status for stability is performed for the first time (not shown).

At step 808, the noise measuring circuit 300 is changed to the AC operating mode, whereby all filters, etc. are reconnected to the circuit 300. The resistance values for $R_f$, $R_d$, and $R_b$ are determined (step 810). In an exemplary embodiment, $R_d$ is selected based on two conditions: (1) the combined resistance of $R_d$ in parallel with the DUT impedance should be greater than or equal to the amplifier impedance $R_{in}$; and (2) the combined voltage drop across $R_d$ and $R_f$ should be less than the maximum voltage that the DUT can sustain. $R_b$, when used, is determined based on similar conditions as for $R_d$. The value of $R_f$ is determined based on RC circuit principles as discussed above in FIG. 4.

Figure 9:
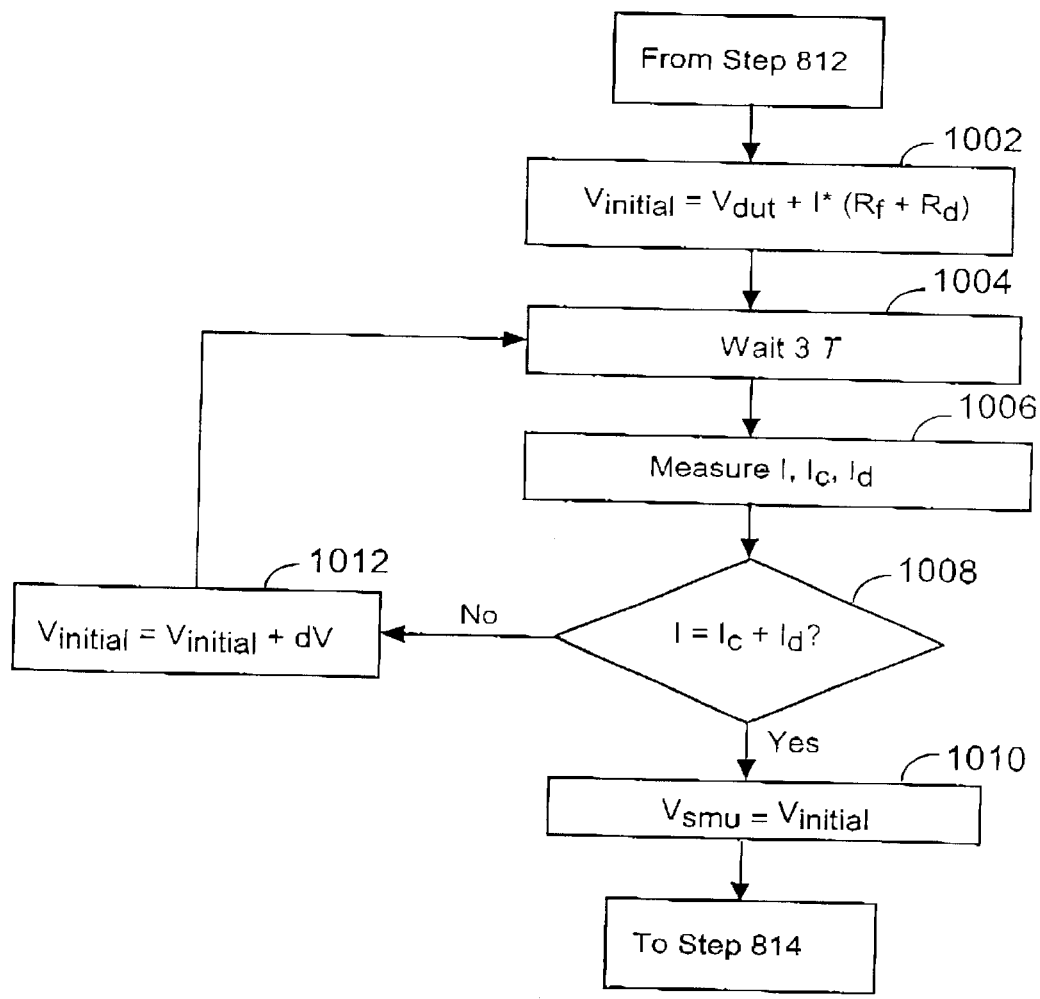
FIG. 9 illustrates an exemplary process for determining voltage supplied by a supply monitor unit in accordance with an embodiment of the invention.
Figure 10:
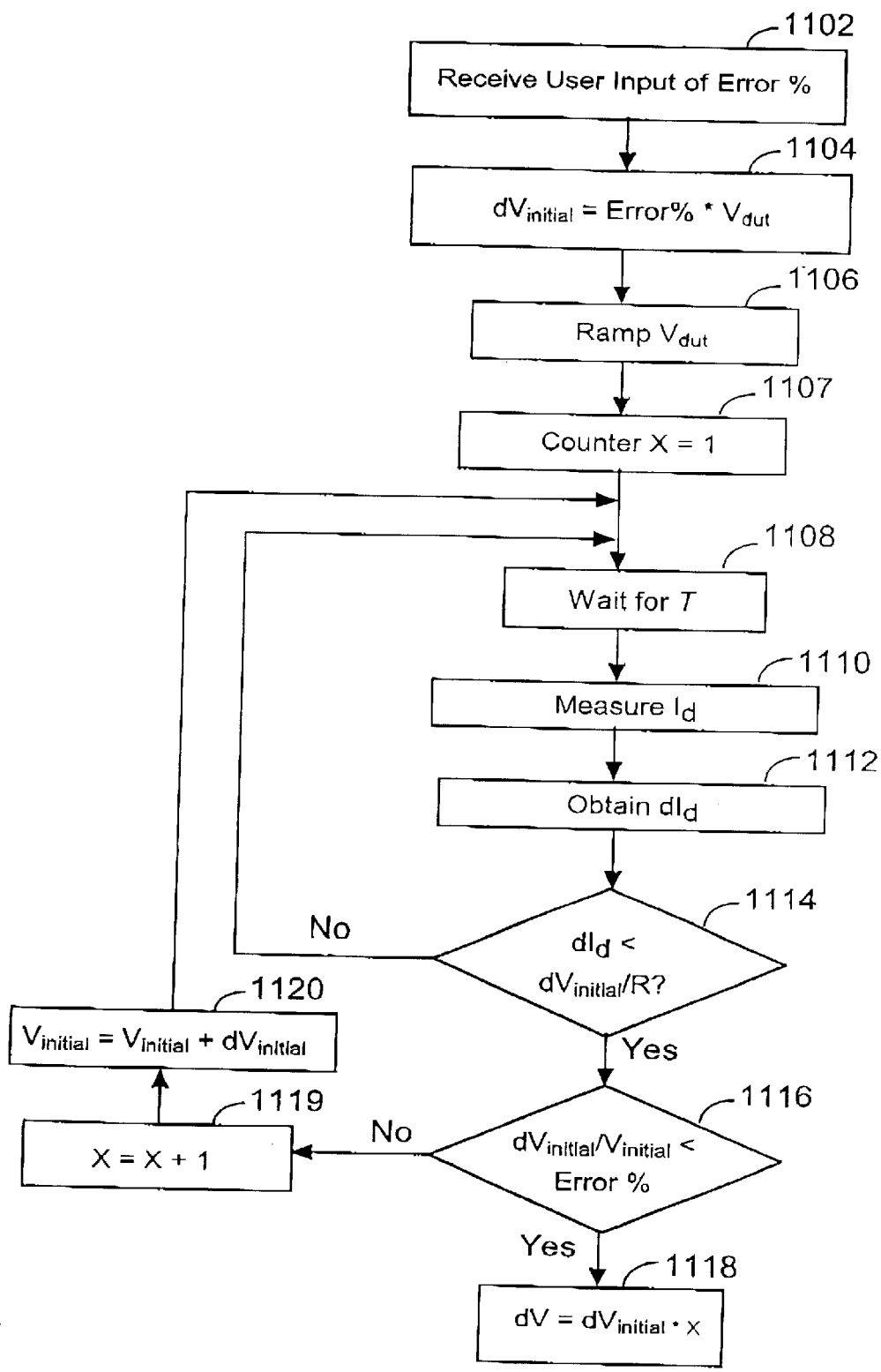
FIG. 10 illustrates an exemplary process for determining ΔV in accordance with an embodiment of the invention.

Based on bias conditions specified and verified at steps 804 and 806, the actual voltage which should be provided by a primary SMU ($V_{smu}$) to achieve such bias conditions has to be determined for each bias condition (step 812). In a MOSFET device, the primary SMU is the one providing the drain current to the device, namely, the SMU 302. A person skilled in the art would recognize that when measuring noise for other types of devices, another SMU may be the primary SMU. For example, if the DUT 301 is a bipolar transistor, the SMU 304 is the primary SMU because its voltage will generate the necessary driving current for the bipolar transistor. FIGS. 9 and 10 below illustrate an exemplary embodiment of step 812 when the DUT is a MOSFET.

Figure 11:
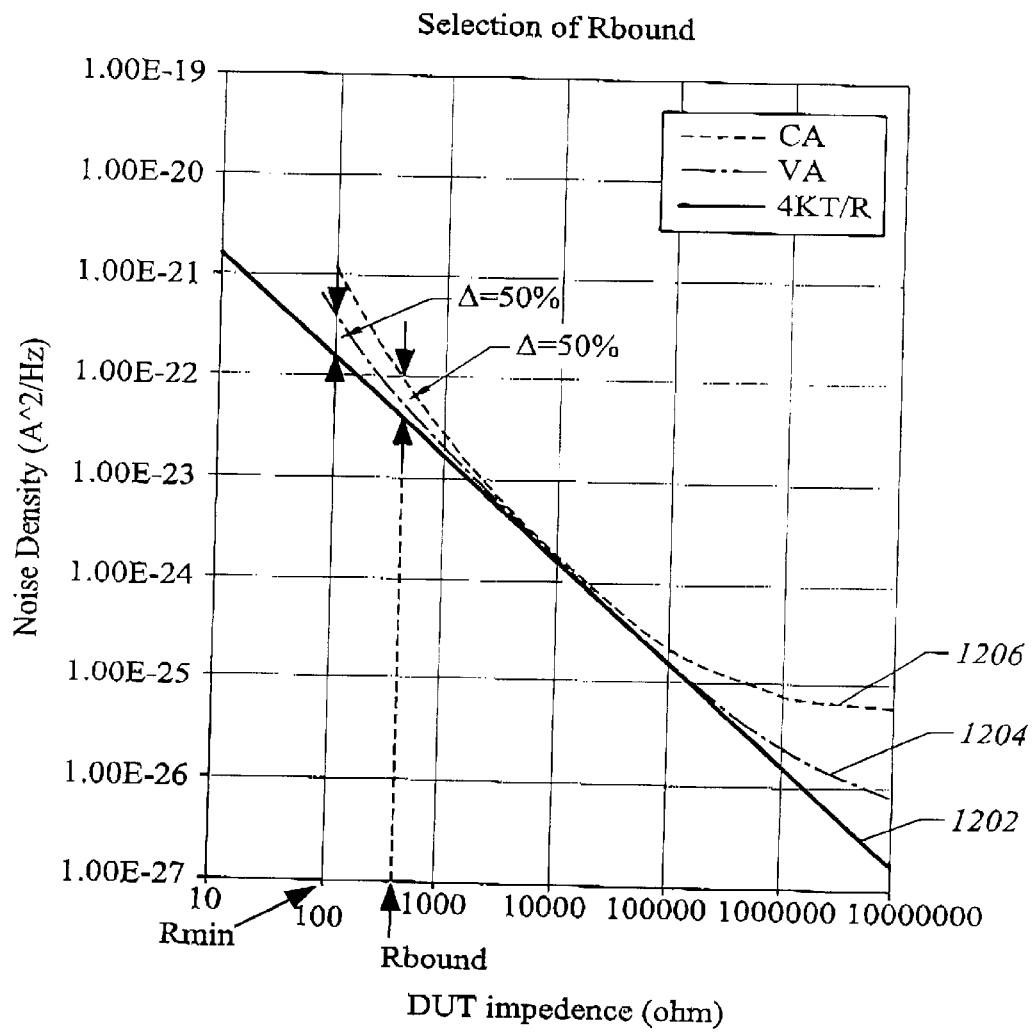
FIG. 11 illustrates an exemplary plot for determining $R_{bound}$ in accordance with an embodiment of the invention.

Next, either a voltage amplifier or a current amplifier is selected (step 814). In an exemplary embodiment, if the variable loading resistance $R_d$ 314 in parallel with the DUT impedance is less than $R_{bound}$, the voltage amplifier is selected; otherwise, the current amplifier is selected. A current amplifier is more accurate in measuring high impedance system; thus, when DUT impedance is high, the current amplifier should be automatically selected. On the other hand, a voltage amplifier is more accurate in measuring low impedance system; thus, when DUT impedance is low, the voltage amplifier should be automatically selected. FIG. 11 below illustrates an exemplary $R_{bound}$. Next, system gains are calibrated at a specified bias condition (step 816). In an exemplary embodiment, an optional step to check amplifier status for stability is performed for the second time (not shown).

Figure 13:
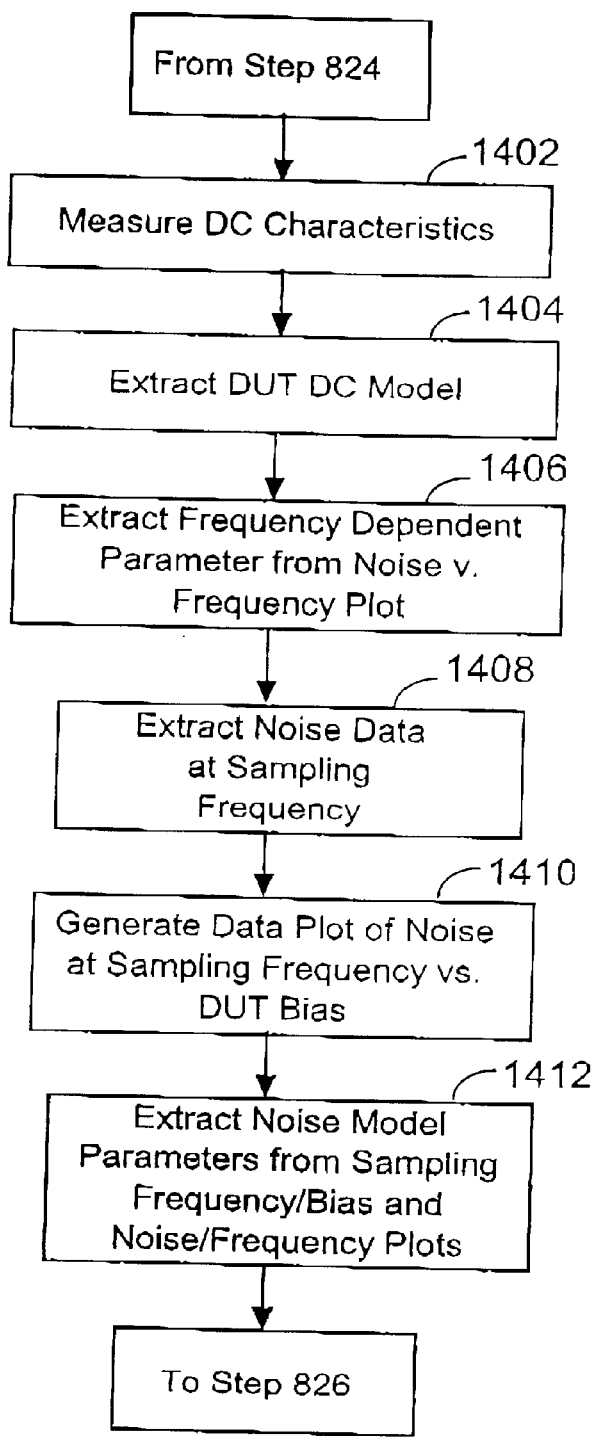
FIG. 13 illustrates an exemplary model extraction process in accordance with an embodiment of the invention.
Figure 14:
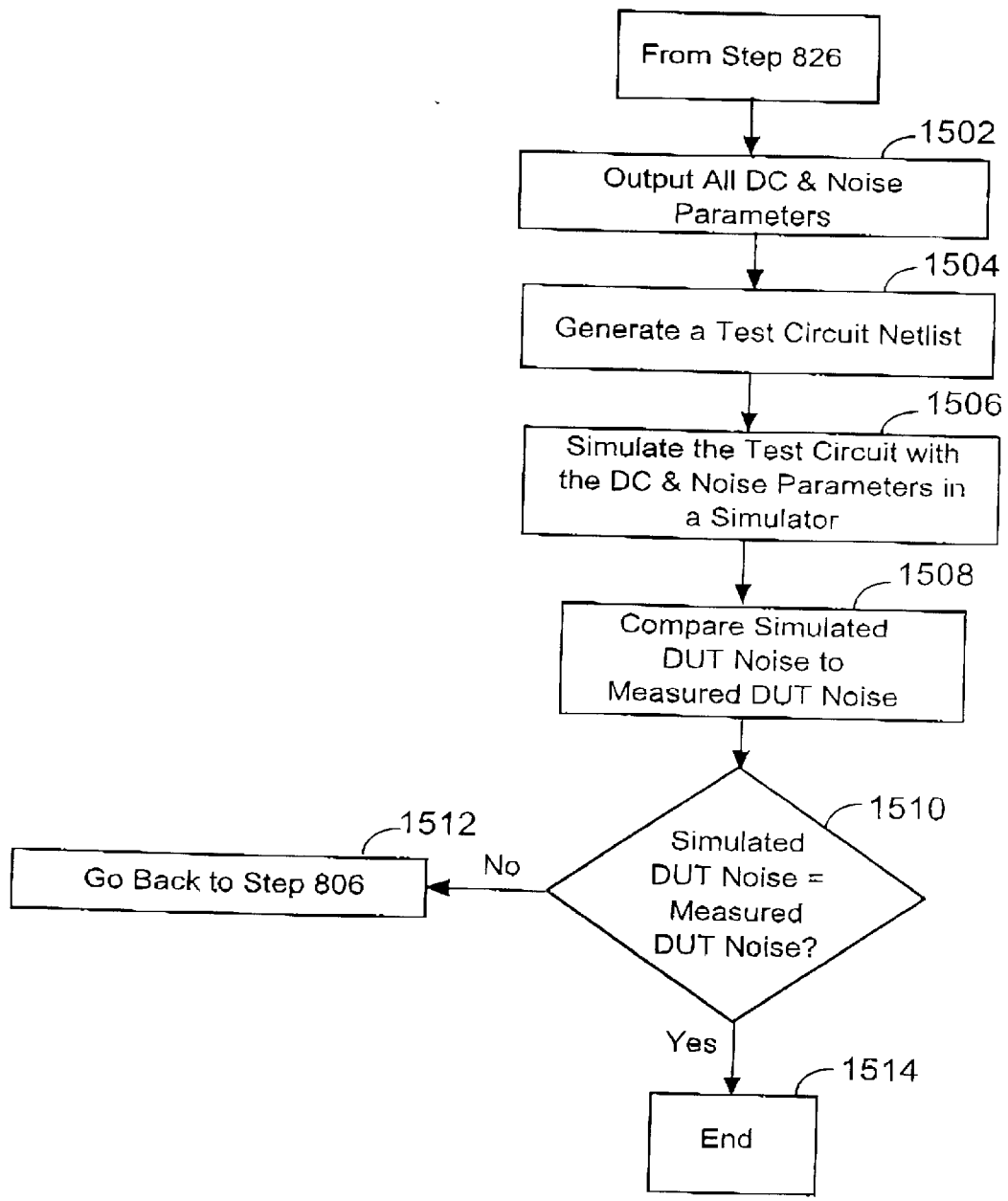
FIG. 14 illustrates an exemplary model verification process in accordance with an embodiment of the invention.

DUT noise data is collected (step 818). If there are multiple specified bias conditions at step 804, the process repeats at step 806 for each bias condition (step 820). If there are no more bias conditions, a de-embedding process is performed (step 822). FIGS. 12A–D below illustrate an exemplary de-embedding process. Next, a model is extracted after the de-embedding process (step 824). FIG. 13 below illustrates an exemplary model extraction process of step 824. Finally, the extracted model is verified by generating a netlist in a simulator such as SPICE and simulating the circuit having the extracted model (step 826). An exemplary embodiment of step 826 is illustrated in FIG. 14 below.

Figure 8:
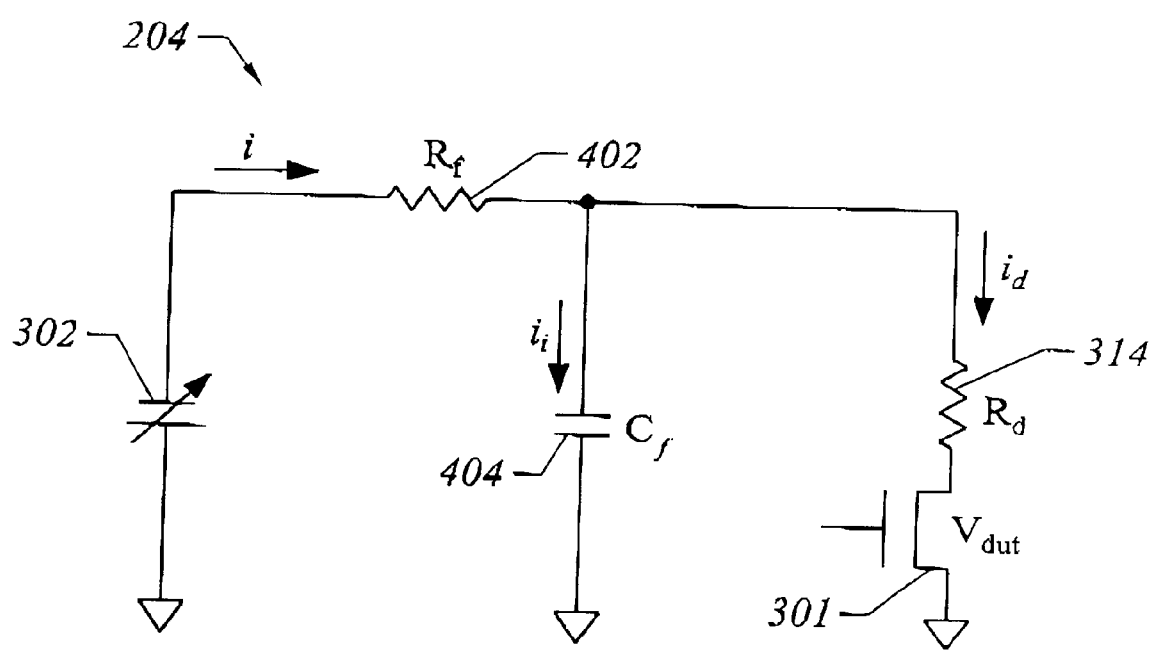
FIG. 8 schematically illustrates an exemplary modified noise measuring circuit in accordance with an embodiment of the invention.

FIG. 8 illustrates an exemplary a simplified noise measurement circuit 300 coupled to the DUT 301 during step 812 in accordance with an embodiment of the invention. In FIG. 8, the noise measuring circuit 300 includes the SMU 302, the filter $F_d$ 308 (including $R_f$ and $C_f$), and the variable loading resistor $R_d$. The SMU 302 provides a voltage in accordance with a bias condition specified at step 804. The provided voltage generates a current, I, which passes through the filter resistor $R_f$ then to the filter capacitor $C_f$ (i.e., $I_c$) and the loading resistor $R_d$ ($I_d$). The current $I_d$ passes to the drain of the DUT to generate a drain to source voltage, $V_{dut}$. A person skilled in the art would recognize that the current I should equal to the sum of the currents $I_c + I_d$ and that the time constant t is equal to $C_f * R_f$.

FIG. 9 illustrates an exemplary embodiment of step 812 for determining $V_{smu}$ when the DUT 301 is a MOSFET. In FIG. 9, an initial $V_{smu}$, or "$V_{initial}$" equal to $V_{dut} + I*(R_f + R_d)$ is supplied by the SMU 302 (step 1002). Any measurement is delayed (e.g., by 3τ) to wait for circuit stability (step 1004). After the delay, the currents I, $I_c$, and $I_d$ are separately measured (step 1006). Next, the measured I is compared to measured $I_c + I_d$ (step 1008). If I is equal to $I_c + I_d$, the value of $V_{smu}$ is set to equal to $V_{initial}$ (step 1010). If not, $V_{initial}$ is set to equal to $V_{initial} + \Delta V$ (step 1012) and the process repeats at step 1002. FIG. 11 below illustrates an exemplary process for determining $\Delta V$.

FIG. 10 illustrates an exemplary process for determining $\Delta V$. At step 1102, an error percentage (E%) representing an acceptable error range is received. In one embodiment, a user is prompted to input an error percentage. In another embodiment, an error percentage is automatically generated. The initial $\Delta V$ value or "$\Delta V_{initial}$" is equal to E% * $V_{dut}$ (step 1104). Next, $V_{dut}$ is slowly ramped up by increasing voltage supplied by the SMU 302 (step 1106). A counter X is set to equal to 1 (step 1107). Measurement is delayed for one τ(step 1108). Next, $I_d$ is measured (step 1110). The measured $I_d$ is compared to the target current $I_d$ measured during step 806. Any current difference between the measured $I_d$ and the target current $I_d$ is $\Delta I_d$ (step 1112). The $\Delta I_d$ is compared to $\Delta V_{initial}/(R_f + R_d)$ (step 1114). If $\Delta I_d$ is less than $\Delta V_{initial}/(R_f + R_d)$, $\Delta V_{initial}/V_{initial}$ is compared to the E% (step 1116). If $\Delta V_{initial}/V_{initial}$ is less than E%, $\Delta V$ is equal to $\Delta V_{initial} * X$ (step 1118). If $\Delta V_{initial}/V_{initial}$ is greater than or equal to the E%, $V_{initial}$ is equal to $V_{initial} + \Delta V_{initial}$ (step 1120). The counter X is incremented by 1 (step 1122) and the process repeats at step 1108. Referring back to step 1114, if $\Delta I_d$ is greater than or equal to $\Delta V_{initial}/(R_f + R_d)$, the process repeats at step 1108.

FIG. 11 illustrates an exemplary $R_{bound}$ obtained at a sample frequency of 2 KHz. In FIG. 11, thermal noise densities at various resistance are plotted as the solid line 1202. In an exemplary embodiment, thermal noises (N) at various resistance can be calculated by the following equation: N=4KT/R, where K is the Blotzmann constant, T is the absolute temperature, and R is the resistance. Thermal noise densities are attained by dividing each calculated thermal noise by the sample frequency. Next, noise densities measured by a voltage amplifier at various resistance are plotted as line VA 1300. Likewise, noise densities measured by a current amplifier at various resistance are plotted as line CA 1206. A noise deviation or ΔNb between the measured noise density at the lowest resistance of line VA 1300 and the thermal noise density at the same resistance in the solid line 1202 is obtained. In this embodiment, Δnb is equal to 5%. Next, a ΔNc equal to ΔNb (or 5%) in line CA 1206 is determined. $R_{bound}$ is equal to the resistance at which ΔNc is equal to ΔNb.

Figure 12A:
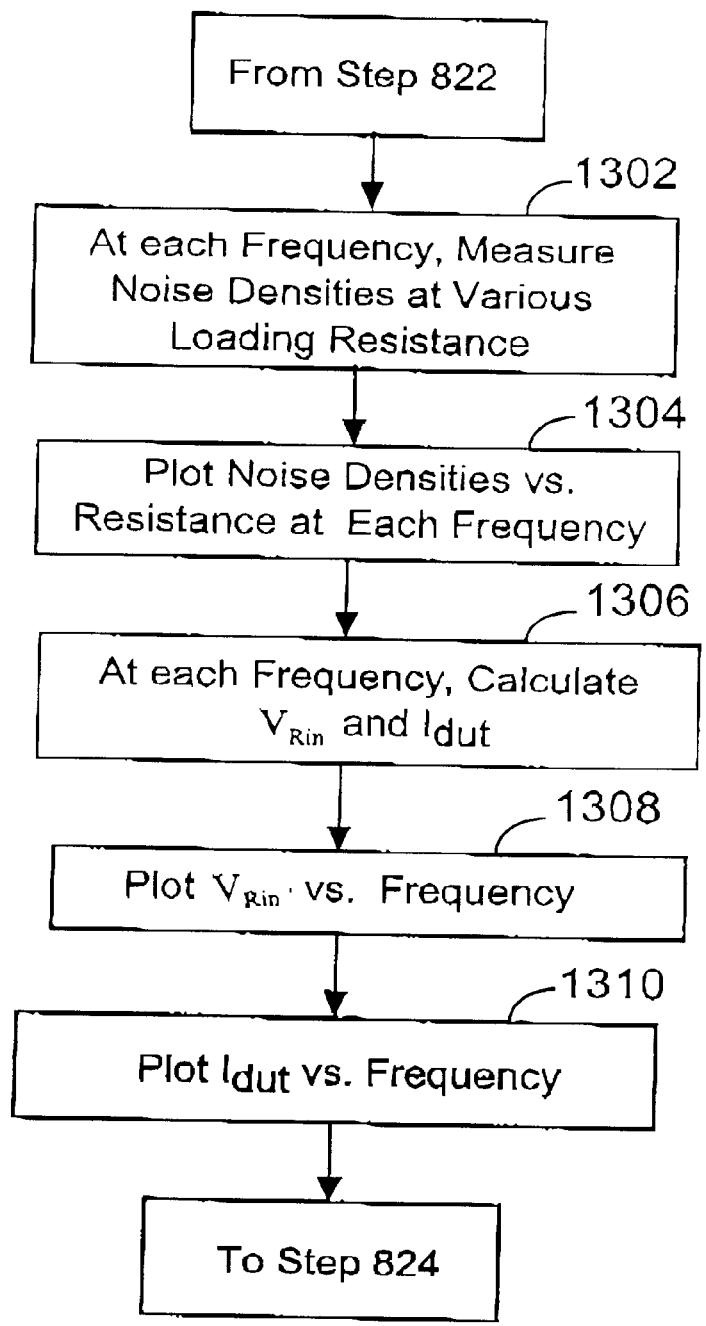
FIG. 12A illustrates an exemplary de-embedding process in accordance with an embodiment of the invention.

FIG. 12A illustrates an exemplary de-embedding process of step 822. During de-embedding, noise generated by the system other than the DUT noise is removed from the total noise measured. At each frequency, noise densities are measured at various loading resistance $R_d$ 314 (step 1302). The measured noise densities versus resistance are plotted for each frequency (step 1304). At each frequency, a DUT noise voltage $V_{dut}$ and a DUT noise current $I_{dut}$ are calculated (step 1306). This calculating step is described in more detail below in FIGS. 13B–D. Plot $V_{dut}$ versus frequency (step 1308). Plot $I_{dut}$ versus frequency (step 1310).

Figure 12B:
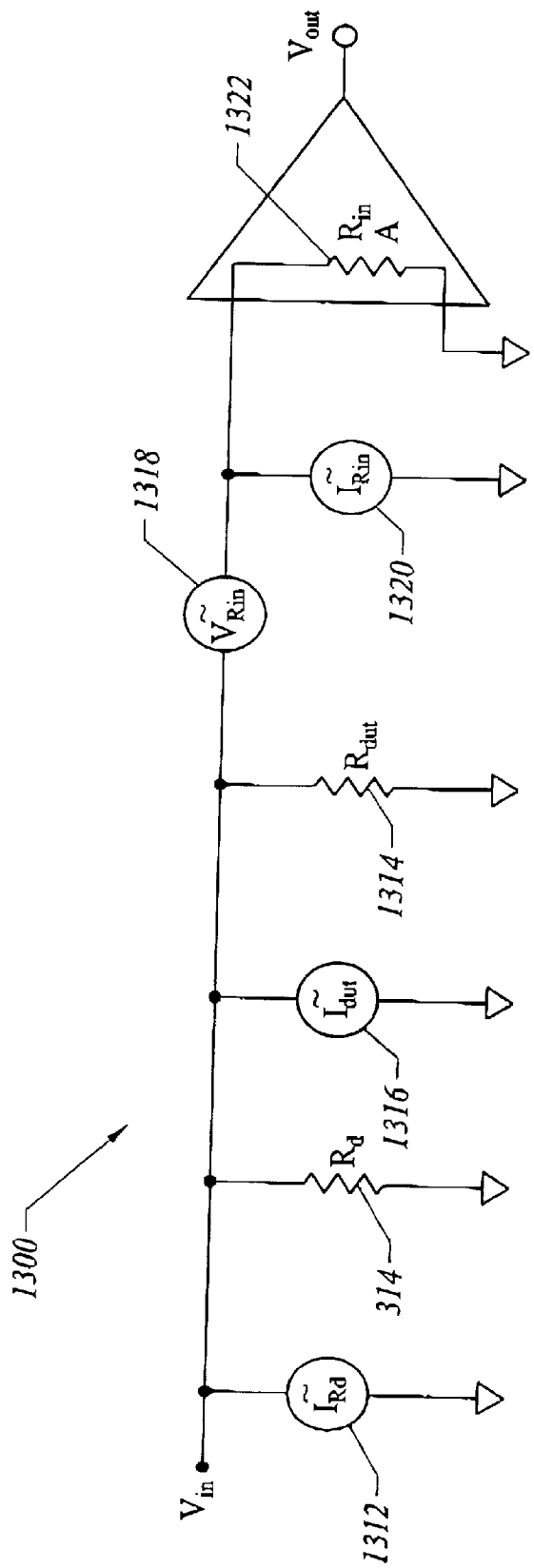
FIG. 12B schematically illustrates an exemplary AC equivalent circuit in accordance with an embodiment of the invention.

In an exemplary embodiment, there are two de-embedding models: a voltage amplifier model or a current amplifier model. FIG. 12B illustrates an AC equivalent circuit 1300 of the noise measuring circuit 300 in a voltage amplifier model. The AC equivalent circuit 1300 has the loading resistor $R_d$ 314, a loading resistor thermal noise current source $I_{Rd}$ 1312, a DUT resistance $R_{dut}$ 1314, a DUT noise current source $I_{dut}$ 1316, an amplifier noise voltage source $V_{Rin}$ 1318, a amplifier resistance thermal noise current source $I_{Rin}$ 1320, and an amplifier resistor $R_{in}$ 1322. The voltage amplifier's output $V_{out}$ can be represented by the following equation:

$$V_{out}^2 = A^2 R_{ref}^2 \left( I_{dut}^2 + I_{Rin}^2 + \frac{4kT}{R_d} \right) + A^2 V_{Rin}^2 \left( \frac{R_{in}}{R_{in} + R_d // R_{dut}} \right)^2 \quad (1)$$

where $R_{ref} = R_d // R_{dut} // R_{in}$, and A is the amplifier gain equal to $V_{out}/V_{in}$.

Figure 12C:
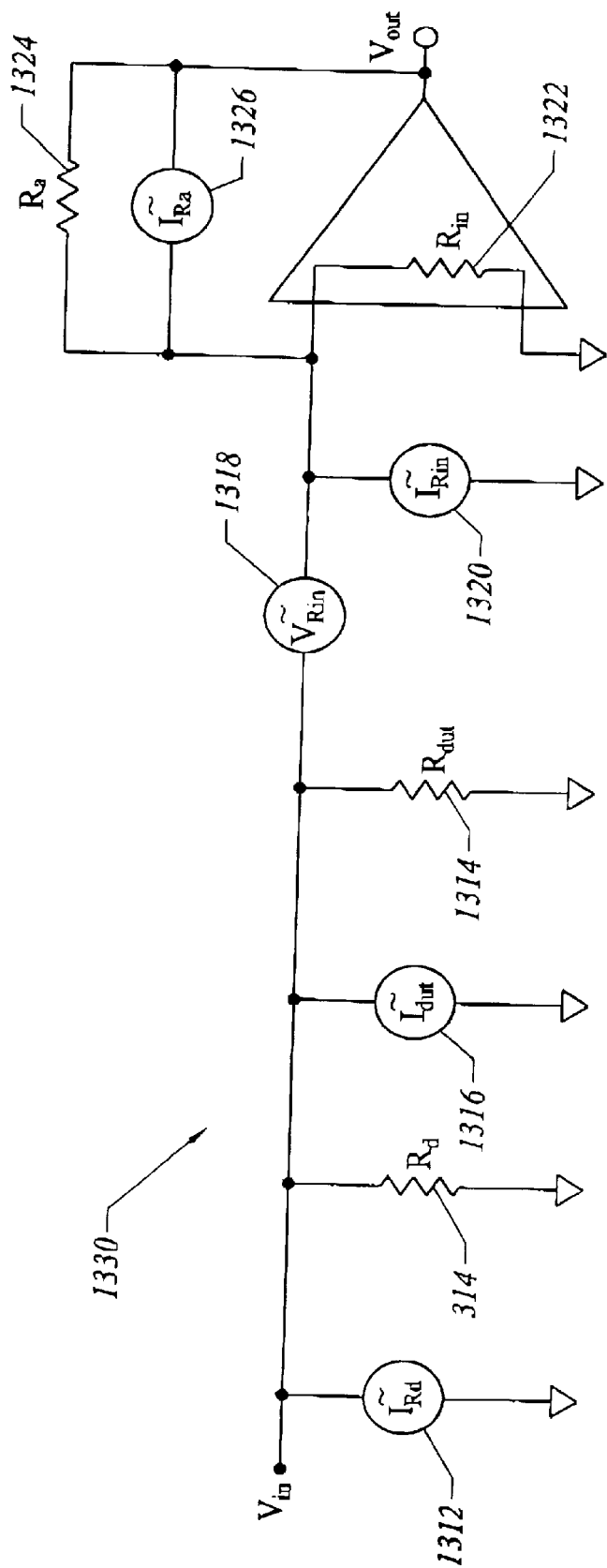
FIG. 12C schematically illustrates another exemplary AC equivalent circuit in accordance with an embodiment of the invention.

FIG. 12C illustrates an AC equivalent circuit 1330 of the noise measuring circuit 300 in a current amplifier model. The AC equivalent circuit 1330 has the loading resistor $R_d$ 314, a loading resistor thermal noise current source $I_{Rd}$ 1312, a DUT resistance $R_{dut}$ 1314, a DUT noise current source $I_{dut}$ 1316, an amplifier noise voltage source $V_{Rin}$ 1318, a amplifier resistance thermal noise current source $I_{Rin}$ 1320, an amplifier resistor $R_{in}$ 1322, a feedback resistor $R_a$ 1324, and a feed back resistor thermal noise current source $I_{Ra}$ 1326. The current amplifier's output $V_{out}$ can be represented by the following equation:

$$V_{out}^2 = R_a^2 \left[ I_{dut}^2 + I_{Rin}^2 + 4kt \left( \frac{1}{R_d} + \frac{1}{R_a} \right) + V_{Rin}^2 \left( \frac{1}{R_d} + \frac{1}{R_a} \right)^2 \right] \quad (2)$$

Figure 12D:
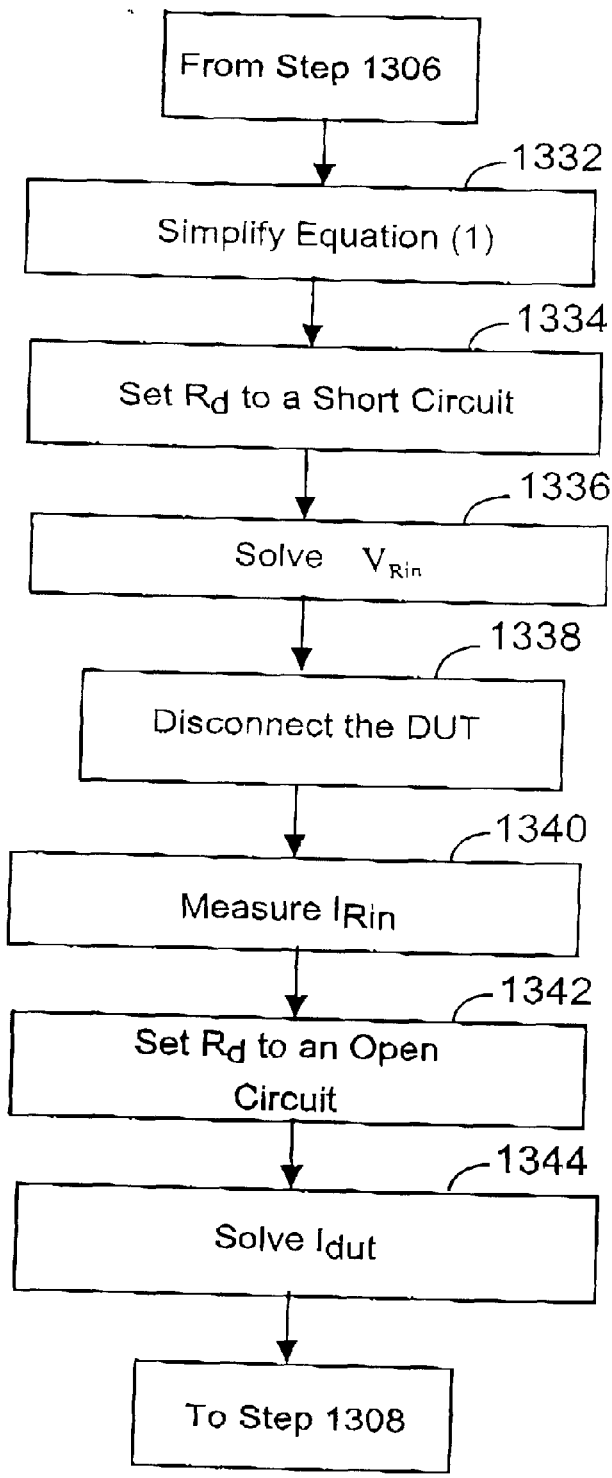
FIG. 12D illustrates an exemplary process in accordance with an embodiment of the invention.

FIG. 12D illustrates an exemplary calculating step 1306 in a voltage amplifier model. Equation (1) is simplified (step 1332). Typically, in voltage amplifier mode, $R_d << R_{in}$ and $R_d << R_{dut}$; thus, equation (1) can be simplified to be:

$$V_{out}^2 = A^2 R_d^2 \left( I_{dut}^2 + I_{Rin}^2 = \frac{4kt}{R_d} \right) + A^2 V_{Rin}^2$$

In general, $V_{Rin}$ and $I_{dut}$ are not bias dependent and $V_{Rin}$ and $I_{dut}$ are a function of frequency (i.e., not thermal noise). In an exemplary embodiment, to solve $V_{Rin}$, $R_d$ is shorted (step 1334). $R_{ref}$ is equal to $R_d // R_{dut} // R_{in}$; thus, when $R_d$ 314 is zero, $R_{ref}$ is also zero. $V_{out} = (V_{out/Vin})*V_{Rin}$; thus, $V_{Rin} = V_{in}$ and $V_{Rin}$ is solved (step 1336). In a preferred embodiment, $R_d$ 314 is variable; thus, $R_d$ 314 can be shorted or grounded quickly. Next, to solve $I_{dut}$, the DUT is disconnected from the AC equivalent circuit 1300 (step 1338). $I_{Rin}$ is measured (step 1340). $R_d$ is an open circuit (step 1342). The measured value of $I_{Rin}$ and $R_d$ are plugged into equation (1) to obtain $I_{dut}$ (step 1344). In one embodiment, a switch is placed around the DUT for quick disconnection. Although only the process of calculating $V_{Rin}$ and $I_{dut}$ in the voltage amplifier model is described, a person skilled in the art would recognize that $V_{Rin}$ and $I_{dut}$ in the current amplifier model can be similarly calculated via equation (2).

FIG. 13 illustrates an exemplary model extraction process step 824. At step 1402, DC characteristics of the DUT 301 are measured. Based on the measured characteristics, a DC model is extracted (step 1404). For example, the DC model includes model parameters based on the drain current ($I_d$), the threshold voltage ($V_t$), and other model parameters. Using a noise vs. frequency plot obtained from step 822, frequency dependent model parameters are extracted (step 1406). Next, noise data is extracted at selected sampling frequencies (step 1408). In one embodiment, a user specifies the sampling frequencies. In another embodiment, the upper and lower boundary frequencies are automatically selected. A data plot of noise at sampling frequency vs. bias conditions is generated (step 1410). Noise model parameters are extracted based on the plots generated at steps 1408 and 1410 (step 1412).

FIG. 14 illustrates an exemplary model verification step of step 826. At step 1502, all DC and noise model parameters are outputted onto a simulator, such as SPICE. A test circuit netlist is generated in the simulator (step 1504). The test circuit is simulated with the DC and noise model parameters (step 1506). In an exemplary embodiment, during simulation, all components within the test circuit other than the DUT is assigned a noise equal to zero. The simulated DUT noise is compared to the measured DUT noise (step 1508). If the simulated DUT noise is equal to the measured DUT noise (step 1510), the process ends (step 1514). Otherwise, the process repeats at step 806 (step 1512).

The foregoing examples illustrate certain exemplary embodiments of the invention from which other embodiments, variations, and modifications will be apparent to those skilled in the art. The invention should therefore not be limited to the particular embodiments discussed above, but rather is defined by the claims.

What is claimed is:

1. An apparatus for measuring noise in a device, comprising:
    a plurality of programmable power supply units;
    a plurality of filter circuits coupled to said power supply units and selective terminals of a device;
    a variable loading resistor circuit coupled to a first terminal of the device;
    a calibration circuit coupled to a second terminal of the device;
    an amplifier circuit coupled to said first terminal of the device; and
    an output analyzer coupled to said amplifier circuit;
    wherein said calibration circuit is configured to provide input signals that are amplified by the device and by said amplifier circuit, and wherein said amplifier circuit has an adjustable amplification that is set to achieve a desired gain for an input signal through the device and the amplification circuit.

2. The apparatus of claim 1, wherein each of said plurality of filter circuits comprises:
    a variable resistor; and
    a capacitor coupled to said variable resistor.

3. The apparatus of claim 1, wherein said variable loading resistor circuit comprises a plurality of resistors selectably coupled in parallel, such that each resistor of said plurality of resistors can be turned on via a switch individually or in combination with other resistors of said plurality of resistors.

4. The apparatus of claim 3, wherein said variable loading resistor circuit further comprises a switch for shorting said variable loading resistor circuit.

5. The apparatus of claim 1, wherein said amplifier circuit includes a first phase amplifier circuit and a second phase amplifier circuit.

6. The apparatus of claim 5, wherein said first phase amplifier circuit comprises:
    a switch assembly, said switch assembly switchable coupling a voltage amplifier,
    a current amplifier, or a short circuit based on an impedance of said device.

7. The apparatus of claim 5, wherein said first phase amplifier circuit is configured to operate in a voltage amplifier mode or a current amplifier mode based on an impedance of said device.

8. The apparatus of claim 5, wherein said second phase amplifier circuit amplifies signals received from said first phase amplifier circuit.

9. The apparatus of claim 1, further comprising a protection circuit for discharging accumulated charge, wherein said protection circuit is switchable coupled to said second terminal of said device.

10. The apparatus of claim 1, further comprising a variable input resistor switchable coupled between said second terminal of said device and a filter circuit.

11. The apparatus of claim 10, wherein said variable input resistor is connected when said device is a bipolar transistor or a deep submicron device.

12. The apparatus of claim 1, wherein said calibration circuit includes an AC generator connected to said second terminal of said device via a capacitor and one or more resistors.

13. An apparatus for measuring noise in a device having at least two terminals including an input terminal and an output terminal, said apparatus comprising:
    programmable power supply units coupled to said input terminal and said output terminal and configured to bias said input terminal and said output terminal;
    filter circuits each coupled between one of said programmable power supply units and a terminal of said device;
    a calibration circuit coupled to said input terminal and configured to provide input signals to said device for calibration of said apparatus;
    a variable loading resistor circuit coupled between said output terminal and one of said filter circuits;
    an amplifier circuit coupled to said output terminal, said amplifier circuit including a first phase amplifier circuit configured to amplify signals from said device and a second phase amplifier circuit configured to amplify signals from said first phase amplifier circuit;
    an output analyzer coupled to said amplifier circuit; and
    an output monitor coupled between said first phase amplifier circuit and said second phase amplifier circuit and configured to monitor an output voltage of said device.

14. The apparatus of claim 13, wherein said variable loading resistor circuit comprises a plurality of resistors selectably coupled in parallel, such that each resistor of said plurality of resistors can be turned on via a switch individually or in combination with other resistors of said plurality of resistors.

15. The apparatus of claim 13, wherein said variable loading resistor circuit further comprises a switch for shorting said variable loading resistor circuit.

16. The apparatus of claim 13, wherein each of said first phase amplifier circuit and said second phase amplifier circuit comprises a switch assembly, said switch assembly switchable coupling a voltage amplifier, a current amplifier, or a short circuit based on an impedance of said device.

17. The apparatus of claim 13, wherein said calibration circuit is configured to provide input signals that are amplified by said device and by said amplifier circuit, and wherein said amplifier circuit has an adjustable amplification that is set to achieve a desired gain of said apparatus.

18. The apparatus of claim 13, wherein said calibration circuit includes an AC generator connected to said input terminal of said device via a capacitor and one or more resistors.

19. The apparatus of claim 13, further comprising a protection circuit for discharging accumulated charge, wherein said protection circuit is switchable coupled to said input terminal of said device.

20. The apparatus of claim 13, further comprising a variable input resistor switchable coupled between said input terminal of said device and a filter circuit, wherein said variable input resistor is connected when said device is a bipolar transistor or a deep submicron device.

* * * * *